(12) United States Patent
Hosaka et al.

(10) Patent No.: US 10,950,467 B2
(45) Date of Patent: Mar. 16, 2021

(54) GAS SUPPLY MECHANISM AND SEMICONDUCTOR MANUFACTURING SYSTEM

(71) Applicant: TOKYO ELECTRON LIMITED, Tokyo (JP)

(72) Inventors: Yuki Hosaka, Miyagi (JP); Yoshihiro Umezawa, Miyagi (JP); Toshiki Nakajima, Miyagi (JP); Mayo Uda, Miyagi (JP); Kenichi Shimono, Kyoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 383 days.

(21) Appl. No.: 15/484,389

(22) Filed: Apr. 11, 2017

(65) Prior Publication Data
US 2017/0301568 A1    Oct. 19, 2017

(30) Foreign Application Priority Data

Apr. 13, 2016   (JP) .............................. JP2016-080216

(51) Int. Cl.
| | |
|---|---|
| *H01L 21/67* | (2006.01) |
| *F16K 5/04* | (2006.01) |
| *H01J 37/32* | (2006.01) |
| *F16K 31/08* | (2006.01) |

(52) U.S. Cl.
CPC ...... *H01L 21/67069* (2013.01); *F16K 5/0442* (2013.01); *F16K 31/086* (2013.01); *H01J 37/3244* (2013.01); *H01J 37/32449* (2013.01); *H01J 37/32834* (2013.01); *H01J 2237/334* (2013.01)

(58) Field of Classification Search
CPC .......... H01J 37/32449; H01J 37/32834; H01J 21/67069; H01J 37/334
See application file for complete search history.

(56) References Cited

U.S. PATENT DOCUMENTS

| | | | | |
|---|---|---|---|---|
| 5,181,539 A | * | 1/1993 | Yokoyama | ................ F16K 5/06 137/625.32 |
| 7,381,274 B2 | * | 6/2008 | Lee | ..................... C23C 16/4401 118/715 |
| 2002/0106310 A1 | * | 8/2002 | Zuk, Jr. | ............... B01F 13/0818 422/535 |

FOREIGN PATENT DOCUMENTS

| | | |
|---|---|---|
| JP | 2013-197183 A | 9/2013 |
| JP | 2015-138810 A | 7/2015 |
| TW | 481241 U | 3/2002 |

* cited by examiner

*Primary Examiner* — Robert M Kunemund
(74) *Attorney, Agent, or Firm* — Studebaker & Brackett PC

(57) ABSTRACT

The mechanism includes a pipe and a valve provided in the pipe. The pipe is configured to connect a gas source and a semiconductor manufacturing apparatus. The valve is configured to control a flow rate of the gas. The valve includes a housing and a columnar shaft. The housing includes an inlet and an outlet. A gas flows from the gas source into the internal space through the inlet. A gas flows from the internal space to the semiconductor manufacturing apparatus through the outlet. A gap is provided between an outer peripheral surface of the shaft and an inner wall surface of the housing. The shaft is accommodated in the internal space of the housing and is rotatable. A through hole which penetrates the shaft is formed on the outer peripheral surface of the shaft. Both ends of the through hole correspond to the inlet and the outlet.

17 Claims, 10 Drawing Sheets

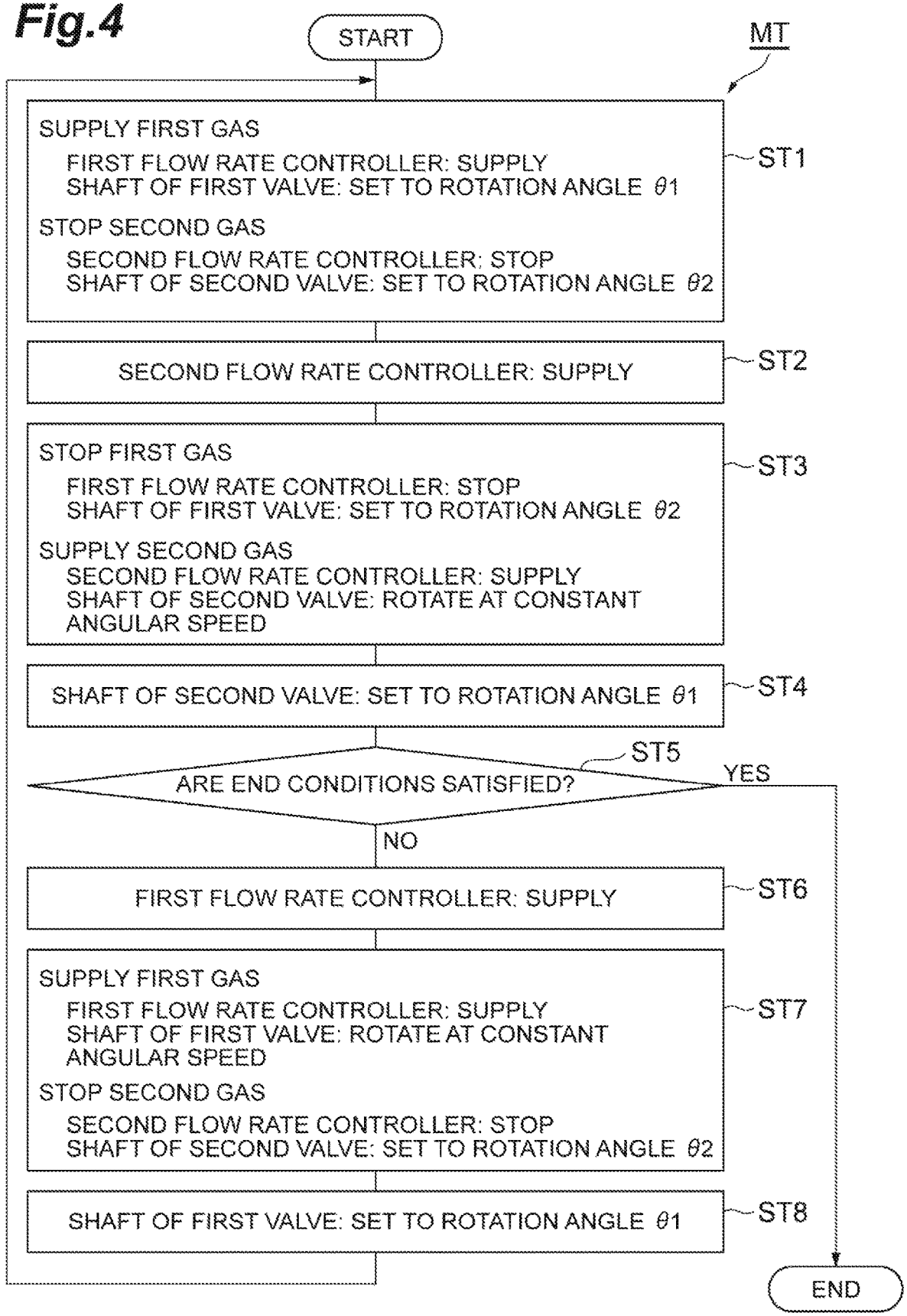

GAS SUPPLY MECHANISM AND SEMICONDUCTOR MANUFACTURING SYSTEM

CROSS-REFERENCE TO RELATED APPLICATION

This application claims the benefit of Japanese Patent Application No. 2016-080216 filed with Japan Patent Office on Apr. 13, 2016, the entire contents of which are hereby incorporated by reference.

TECHNICAL FIELD

Exemplary embodiments of the present disclosure relates to a gas supply mechanism and a semiconductor manufacturing system.

BACKGROUND

Japanese Unexamined Patent Publication No. 2013-197183 discloses a semiconductor manufacturing system. The semiconductor manufacturing system includes a processing container (chamber) and a diffusion chamber which is disposed inside the processing container and communicates with the processing container. The system supplies a first gas and a second gas from gas supply sources into the processing container through the diffusion chamber, and repeatedly performs an etching process and a deposition process which plasma-process a silicon substrate. In the semiconductor manufacturing system, at timing when the etching process and the deposition process are switched, while a remaining gas of a previous process in the diffusion chamber is exhausted, a gas of the next process is introduced into the diffusion chamber, and opening and closing of a valve causes the gas of the next process to rapidly flow into the diffusion chamber. Accordingly, remaining of the gas of the previous process is prevented, and a time in which the gases between processes are switched is shortened.

SUMMARY

In a first aspect, a gas supply mechanism for supplying a gas from a gas source to a semiconductor manufacturing apparatus is provided. The mechanism includes a pipe and a valve provided in the pipe. The pipe is configured to connect the gas source and the semiconductor manufacturing apparatus to each other. The valve is configured to control a flow rate of the gas which is supplied from the gas source to the semiconductor manufacturing apparatus. The valve includes a housing in which a cylindrical internal space is formed in the inside, and a columnar shaft. The housing includes an inlet and an outlet. A gas flows from the gas source into the internal space through the inlet. A gas flows from the internal space to the semiconductor manufacturing apparatus through the outlet. A gap is provided between an outer peripheral surface of the shaft and an inner wall surface of the housing. The shaft is accommodated in the internal space of the housing and is rotatable about an axis of the shaft. A through hole which penetrates the shaft is formed on the outer peripheral surface of the shaft. Both ends of the through hole correspond to the inlet and the outlet.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 4 is a flowchart showing a gas supply method of the exemplary gas supply mechanism.

DETAILED DESCRIPTION

Figure 1:
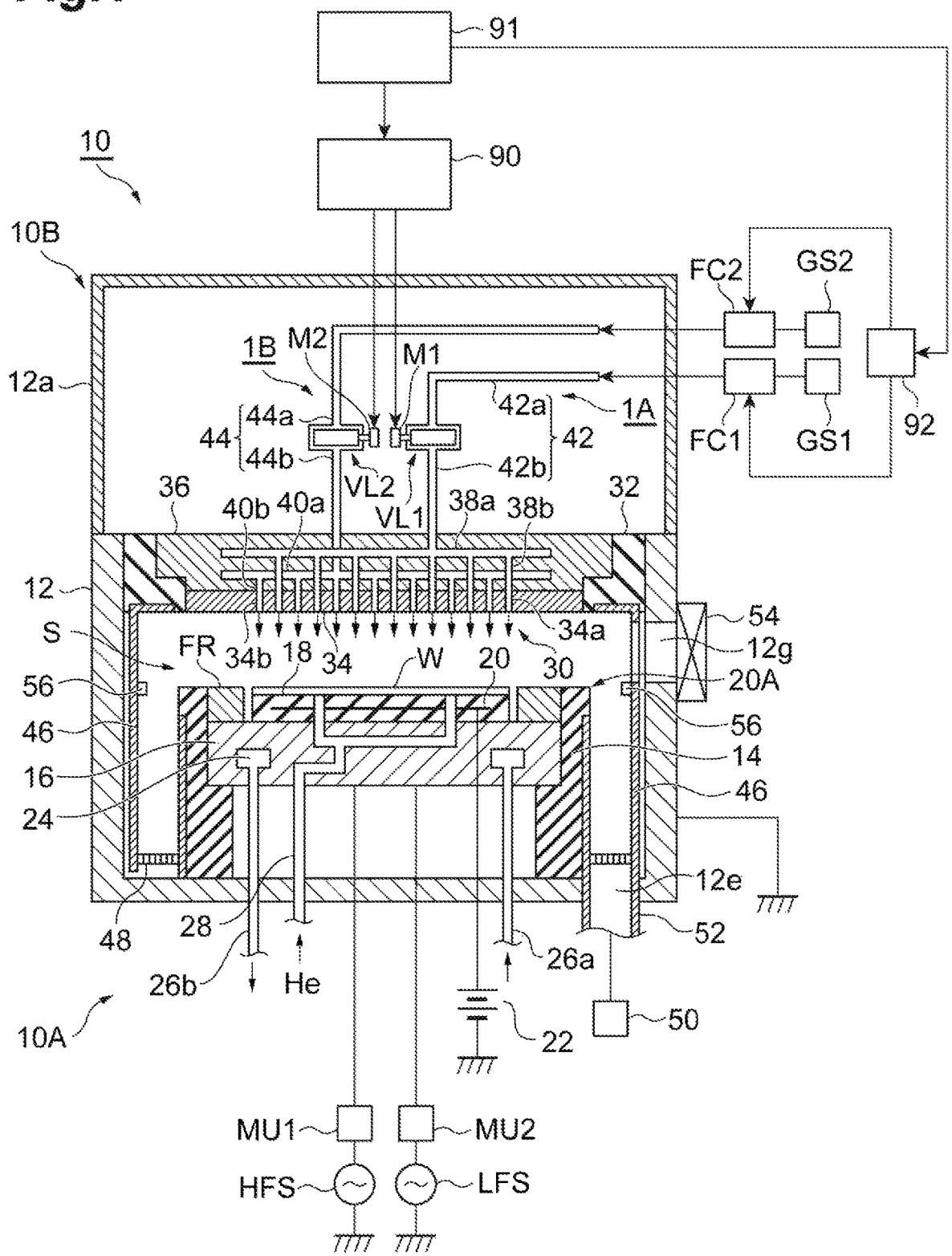
FIG. 1 is a sectional view schematically showing a semiconductor manufacturing system according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the semiconductor manufacturing system described in Japanese Unexamined Patent Publication No. 2013-197183, in the case where the gas of the next process rapidly flows into the diffusion chamber, the pressure inside the processing container which communicates with the diffusion chamber suddenly increases, and there is a concern that the pressure inside the processing container may largely exceed a target value. In this case, a time until the pressure decreases to the target value to be stabilized is required, and there is a concern that a switching time between the deposition process and the etching process may be lengthened.

Meanwhile, it is conceivable to improve the length of the switching time between the deposition process and the etching process by intermittently supplying the gas of the next process to the diffusion chamber at a minute step while switching opening and closing of the valve at a high speed to perform a fine pressure control, and by preventing the pressure inside the processing container from largely exceeding the target value. In general, as the valve, a diaphragm type valve is provided, in which a diaphragm and a valve seat are provided and the diaphragm seats on the valve seat to block a flow path. However, in a case where the opening and closing of the diaphragm type valve are switched at a high speed, wear at a location at which the diaphragm and the valve seat abut on each other rapidly progresses, and there is a concern that the valve may be damaged.

Accordingly, in this technical field, there is a demand for providing a gas supply mechanism and a semiconductor manufacturing system having improved endurance.

In a first aspect, a gas supply mechanism for supplying a gas from a gas source to a semiconductor manufacturing apparatus is provided. The mechanism includes a pipe and a valve provided in the pipe. The pipe is configured to connect the gas source and the semiconductor manufacturing apparatus to each other. The valve is configured to control a flow rate of the gas which is supplied from the gas source to the semiconductor manufacturing apparatus. The valve includes a housing in which a cylindrical internal space is formed in the inside, and a columnar shaft. The housing includes an inlet and an outlet. A gas flows from the gas source into the internal space through the inlet. A gas flows from the internal space to the semiconductor manufacturing apparatus through the outlet. A gap is provided between an outer peripheral surface of the shaft and an inner wall surface of the housing. The shaft is accommodated in the internal space of the housing and is rotatable about an axis of the shaft. A through hole which penetrates the shaft is formed on the outer peripheral surface of the shaft. Both ends of the through hole correspond to the inlet and the outlet.

In the gas supply mechanism according to the first aspect, the shaft rotates, the valve is open when both ends of the through hole are positioned at the inlet and the outlet of the housing, and gas supplied from the gas source passes through the valve and flows to the semiconductor manufacturing apparatus. The shaft further rotates, the valve is closed when both ends of the through hole are not positioned at the inlet and the outlet of the housing, and gas supplied from the gas source is blocked by the shaft and does not flow to the semiconductor manufacturing apparatus. In this way, since the gas supply mechanism according to the first aspect does not have a configuration such as a diaphragm type valve in which a diaphragm seats on a valve seat to block a flow path, rapid progression of wear at a location at which the diaphragm and the valve seat abut on each other does not occur, the valve is not damaged, and improved endurance is obtained. In addition, in the gas supply mechanism according to the first aspect, since the housing has the cylindrical internal space and the shaft is columnar, it is possible to accommodate the shaft in the internal space of the housing in the axial direction of the shaft, and assembly of the valve can be easily performed.

In an exemplary embodiment, the gas supply mechanism may further include a plurality of seal members configured to contact with the inner wall surface of the housing and the outer peripheral surface of the shaft, and the plurality of seal members may be provided such that the inlet and the outlet are disposed between the seal members in an axial direction of the shaft. Accordingly, it is possible to prevent gas from being leaked from the inlet to the outlet through a gap between the inner wall surface of the housing and the outer peripheral surface of the shaft.

In an exemplary embodiment, the gas supply mechanism may further include a drive unit configured to rotate the shaft about the axis of the shaft; and a control unit configured to control the drive unit. Accordingly, it is possible to automatically control a rotation angle of the shaft.

In the gas supply mechanism in an exemplary embodiment, the drive unit may include a rotary shaft and a drive-side magnet which is provided in the rotary shaft, a driven-side magnet which is disposed to face the drive-side magnet via a side wall of housing may be fixed to the shaft, and the side wall of the housing may be a nonmagnetic material. Accordingly, it is not necessary to directly connect the drive unit provided outside the housing and the shaft accommodated in the housing to each other via the side wall of the housing, sealability of the housing is improved, wear of the side wall of the housing is prevented, and it is possible to improve endurance.

In a second aspect, there is provided a semiconductor manufacturing system including the above-described gas supply mechanism according to the first aspect. Accordingly, it is possible to provide a semiconductor manufacturing system having improved endurance.

As described above, it is possible to provide a gas supply mechanism and a semiconductor manufacturing system having improved endurance.

Hereinafter, various exemplary embodiments will be described in detail with reference to accompanying drawings. Meanwhile, like elements in respective drawings will be denoted by like reference numerals.

(First Exemplary Embodiment)

FIG. 1 is a sectional view schematically showing a semiconductor manufacturing system 10 according to an exemplary embodiment. As shown in FIG. 1, the semiconductor manufacturing system 10 is a capacity coupling type parallel flat plate plasma etching apparatus, and includes a semiconductor manufacturing apparatus 10A and a gas supply device 10B.

The semiconductor manufacturing apparatus 10A includes an approximately cylindrical processing container 12, a placement table 20A, and an upper electrode 30.

For example, the processing container 12 is configured of aluminum in which the surface is anodized. The processing container 12 is grounded for safety. A carrying in/out port 12g of a workpiece W is provided on the side wall of the processing container 12. The carrying in/out port 12g can be opened and closed by a gate valve 54.

The placement table 20A is accommodated inside the processing container 12, and includes a support portion 14, a lower electrode 16, an electrostatic chuck 18, and a focus ring FR.

The support portion 14 is disposed on a bottom portion of the processing container 12 and the lower electrode 16 is supported by the inner wall surface of the support portion 14. For example, the lower electrode 16 is configured of metal such as aluminum, and has an approximate disk shape.

A first high frequency power source HFS is connected to lower electrode 16 via a matching unit MU1. The first high frequency power source HFS is a power source which generates a high frequency power for generating plasma, and generates frequency of 27 to 100 MHz, for example, high frequency power of 40 MHz. The matching unit MU1 has a circuit for matching output impedance of the first high frequency power source HFS with input impedance of a load side (lower electrode 16 side).

In addition, a second high frequency power source LFS is connected to the lower electrode 16 via a matching unit MU2. The second high frequency power source LFS generates high frequency power (high frequency bias power) such that the workpiece W pulls ions and supplies the high frequency bias power to the lower electrode 16. The frequency of the high frequency bias power is frequency within a range from 400 kHz to 13.56 MHz, and for example, is 3 MHz. The matching unit MU2 has a circuit for matching output impedance of the second high frequency power source LFS with input impedance of the load side (lower electrode 16 side).

The electrostatic chuck 18 is provided on the lower electrode 16, and has a structure in which an electrode 20 which is a conductive film is disposed between a pair of insulation layers or a pair of insulation sheets. A direct-current power source 22 is electrically connected to the electrode 20. The electrostatic chuck 18 can suction and hold the workpiece W by an electrostatic force such as a Coulomb force generated by direct currents from the direct-current power source 22.

The focus ring FR is disposed on an outer periphery of the electrostatic chuck 18 on an upper surface of the lower electrode 16. The focus ring FR is provided to improve uniformity of etching. The focus ring FR is configured of a material which is appropriately selected according to the material of the layer to be etched, and for example, can be formed of silicon, quartz, or the like.

A refrigerant chamber 24 is provided inside the lower electrode 16. A refrigerant having a predetermined temperature, for example, a cooling water is circulation-supplied to the refrigerant chamber 24 via pipes 26a and 26b from a chiller unit provided on the outside. The temperature of the workpiece W displaced on the electrostatic chuck 18 is controlled by controlling the temperature of the refrigerant which is circulated in this way.

Moreover, a gas supply line 28 is provided in the lower electrode 16 and the electrostatic chuck 18. The gas supply line 28 supplies a heat-transfer gas, for example, He gas from a heat-transfer gas supply mechanism to a portion between the upper surface of the electrostatic chuck 18 and the rear surface of the workpiece W.

The semiconductor manufacturing apparatus 10A further includes a deposit shield 46. The deposit shield 46 is detachably provided along the inner wall of the processing container 12. The deposit shield 46 is also provided on the outer periphery of the support portion 14. The deposit shield 46 prevents etching by-products (deposits) from being attached to the processing container 12, and for example, is configured by coating ceramics such as $Y_2O_3$ to an aluminum material.

In addition, a conductive member (GND block) 56 is provided on the inner wall of the processing container 12. The conductive member 56 is attached to the inner wall of the processing container 12 so as to be positioned at approximately the same height as that of the workpiece W in the height direction. The conductive member 56 is DC-connected to the ground and exerts an abnormal discharge prevention effect.

In addition, an exhaust plate 48 is provided between the support portion 14 and the inner wall of the processing container 12 on the bottom portion side of the processing container 12. For example, the exhaust plate 48 is configured by coating ceramics such as $Y_2O_3$ to an aluminum material. In the processing container 12, an exhaust port 12e is provided below the exhaust plate 48. An exhaust device 50 is connected to the exhaust port 12e via an exhaust pipe 52. The exhaust device 50 includes a vacuum pump such as a turbo molecular pump and can decrease the pressure inside the processing container 12 to a desired degree of vacuum.

The upper electrode 30 is disposed above the placement table 20A to face the placement table 20A. The placement table 20A and the upper electrode 30 are provided so as to be approximately parallel to each other. A processing space S for performing plasma etching on the workpiece W is defined between the upper electrode 30 and the placement table 20A.

The upper electrode 30 is supported by the upper portion of the processing container 12 via an insulation shield member 32. The upper electrode 30 includes an electrode plate 34 and an electrode support 36.

The electrode plate 34 faces the processing space S, and a plurality of gas ejection holes 34a and a plurality of gas ejection holes 34b which eject gas to the processing space S are defined in the electrode plate 34. For example, the electrode plate 34 is configured of a low-resistance conductor or semiconductor having small joule heat.

The electrode support 36 detachably supports the electrode plate 34, and for example, is configured of a conductive material such as aluminum. The electrode support 36 has a water cooling structure. In addition, a first gas diffusion chamber 38a and a second gas diffusion chamber 40a are provided inside the electrode support 36. A plurality of gas communication holes 38b which communicate with the gas ejection holes 34a extend downward from the bottom portion of the first gas diffusion chamber 38a. In addition, a plurality of gas communication holes 40b which communicate with the gas ejection holes 34b extend downward from the bottom portion of the second gas diffusion chamber 40a. A first gas source GS1 is connected to the upper portion of the first gas diffusion chamber 38a via a first gas supply mechanism 1A and a first flow rate controller FC1 described below. In addition, a second gas source GS2 is connected to the upper portion of the second gas diffusion chamber 40a via a second gas supply mechanism 1B and a second flow rate controller FC2 described below.

The gas supply device 10B includes the first gas source GS1, the first flow rate controller FC1, a gas control unit 92, a main control unit 91, the first gas supply mechanism 1A, the second gas source GS2, the second flow rate controller FC2, and the second gas supply mechanism 1B.

For example, the first gas source GS1 is a gas source of a first gas for etching the workpiece W. The upstream side of the first flow rate controller FC1 is connected to the first gas source GS1, and the downstream side of first flow rate controller FC1 is connected to the first gas supply mechanism 1A. The first flow rate controller FC1 is configured to control the supply and the supply stop of the first gas from the first gas source GS1 and control the flow rate of the first gas. For example, the first flow rate controller FC1 includes a valve and a mass flow controller.

For example, the second gas source GS2 is a gas source of a second gas having deposition properties with respect to the surface of the workpiece W. The upstream side of the second flow rate controller FC2 is connected to the second gas source GS2, and the downstream side of the second flow rate controller FC2 is connected to the second gas supply mechanism 1B. The second flow rate controller FC2 is configured to control the supply and the supply stop of the second gas from the second gas source GS2 and control the flow rate of the second gas. For example, the second flow rate controller FC2 includes a valve and a mass flow controller.

The gas control unit 92 is connected to the first flow rate controller FC1 and the second flow rate controller FC2. The gas control unit 92 transmits a control signal of each of the first flow rate controller FC1 and the second flow rate controller FC2, and controls the first flow rate controller FC1 and the second flow rate controller FC2. Specifically, the gas control unit 92 transmits the control signal to the first flow rate controller FC1 to control the supply and the supply stop of the first gas from the first gas source GS1 and control the flow rate of the first gas. In addition, the gas control unit 92 transmits the control signal to the second flow rate controller FC2 to control the supply and the supply stop of the second gas from the second gas source GS2 and control the flow rate of the second gas. The gas control unit 92 is controlled by the main control unit 91.

Hereinafter, the first gas supply mechanism 1A and the second gas supply mechanism 1B will be described. The first gas supply mechanism 1A includes a first pipe 42, a first valve VL1, and a motor M1. The second gas supply mechanism 1B includes a second pipe 44, a second valve VL2, and a motor M2. In addition, the first gas supply mechanism 1A and the second gas supply mechanism 1B share the motor control unit 90.

The first pipe 42 connects the first gas source GS1 and the semiconductor manufacturing apparatus 10A to each other. Specifically, an upstream portion 42a of the first pipe 42 is connected to the downstream side of the first flow rate controller FC1, and a downstream portion 42b of the first pipe 42 is connected to the upstream side of the first gas diffusion chamber 38a. A first gas supply path 43 for transporting the first gas is formed inside the first pipe 42.

In addition, the second pipe 44 connects the second gas source GS2 and the semiconductor manufacturing apparatus 10A to each other. Specifically, an upstream portion 44a of the second pipe 44 is connected to the downstream side of the second flow rate controller FC2, and a downstream portion 44b of the second pipe 44 is connected to the upstream side of the second gas diffusion chamber 40a. A second gas supply path for transporting the second gas is formed inside the second pipe 44.

The first valve VL1 is provided in the first pipe 42 and controls the flow rate of the first gas which is supplied from the first gas source GS1 to the semiconductor manufacturing apparatus 10A. Specifically, the upstream side of the first valve VL1 is connected to the upstream portion 42a of the first pipe 42, and the downstream side of the first valve VL1 is connected to the downstream portion 42b of the first pipe 42.

In addition, the second valve VL2 is provided in the second pipe 44 and controls the flow rate of the second gas which is supplied from the second gas source GS2 to the semiconductor manufacturing apparatus 10A. Specifically, the upstream side of the second valve VL2 is connected to the upstream portion 44a of the second pipe 44, and the downstream side of the second valve VL2 is connected to the downstream portion 44b of the second pipe 44.

The first valve VL1 has a function which increases and decreases conductance of the first gas supply path 43 (refer to FIGS. 2A and 2B) which is formed by the first pipe 42, and the second valve VL2 has a function which increases and decreases conductance of the second gas supply path which is formed by the second pipe 44.

Figure 2A:
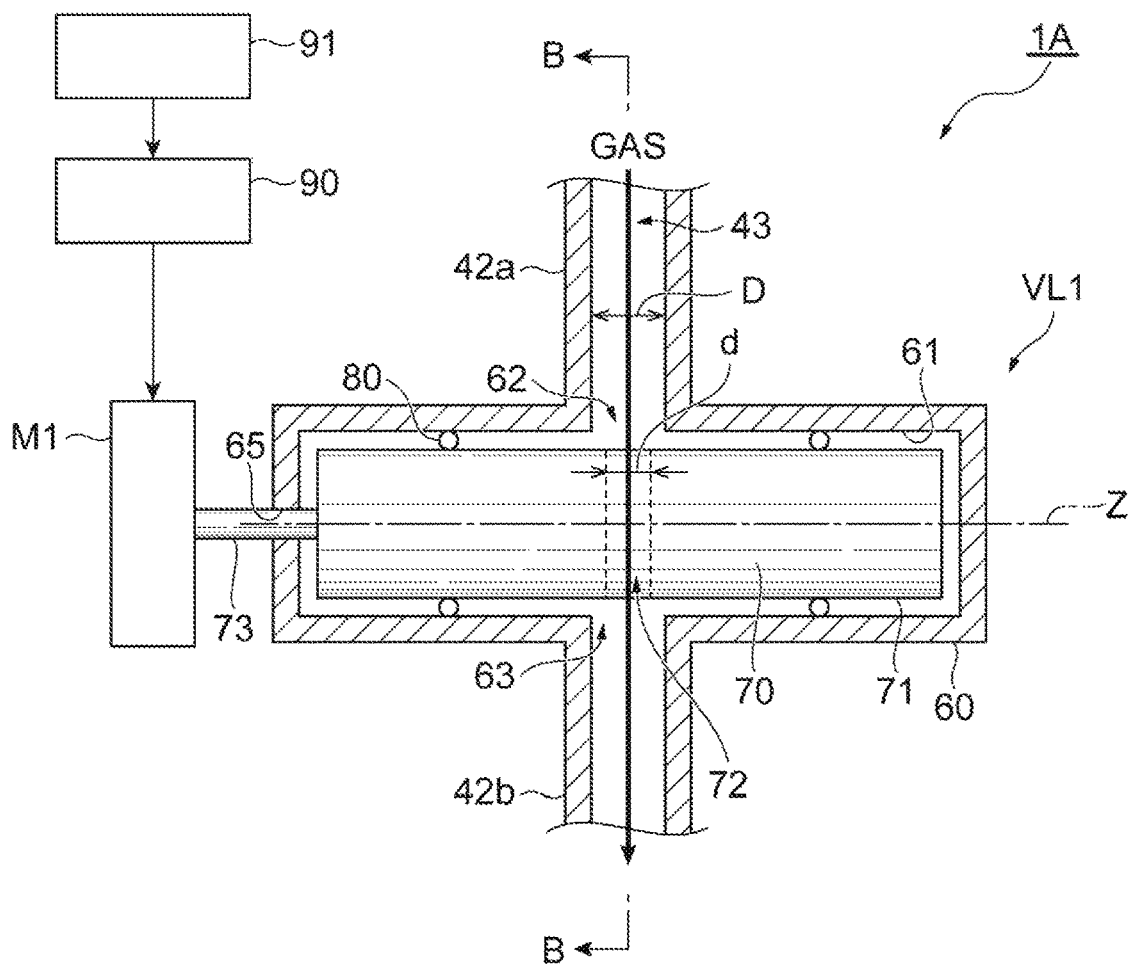
FIGS. 2A and 2B are sectional views schematically showing an exemplary gas supply mechanism.
Figure 2B:
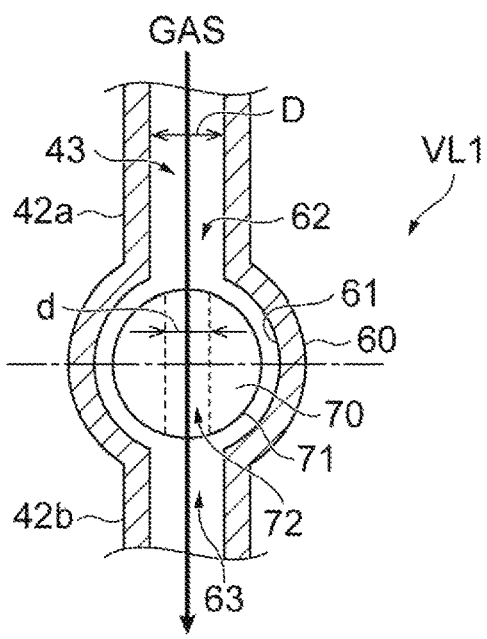

The motor M1 is a drive unit for driving the first valve VL1 and includes a rotary shaft 73 (refer to FIGS. 2A and 2B). For example, the rotary shaft 73 can use a rod-shaped shaft. In addition, the first valve VL1 is connected to the rotary shaft 73 and is driven by the driving of the motor M1.

The motor M2 is a drive unit for driving the second valve VL2 and includes a rotary shaft. For example, the rotary shaft can use a rod-shaped shaft. In addition, the second valve VL2 is connected to the rotary shaft and is driven by the driving of the motor M2.

Rotation angles, rotating speeds, rotation torque, or the like of motors M1 and M2 is controlled by the motor control unit 90. In addition, the motor control unit 90 is controlled by the main control unit 91.

Next, the first valve VL1 will be described in detail with reference to FIGS. 1 to 3B. Moreover, since the configuration of the second valve VL2 is the same as that of the first valve VL1, detail description thereof is omitted. FIGS. 2A and 2B are sectional views schematically showing the first valve VL1. As shown in FIG. 2A, the first valve VL1 includes a housing 60 and a shaft 70.

A cylindrical internal space is formed inside the housing 60. In addition, an inlet 62 through which the first gas flows from the first gas source GS1 into the internal space of the housing 60 is formed in the housing 60. Specifically, the upstream side of the housing 60 is connected to the upstream portion 42a of the first pipe 42, and the inlet 62 which communicates with the internal space of the housing 60 and the first gas supply path 43 of the first pipe 42 is formed in the connection portion. In addition, an outlet 63 through which the first gas flows from the internal space of the housing 60 to the semiconductor manufacturing apparatus 10A is formed in the housing 60. Specifically, the downstream side of the housing 60 is connected to the downstream portion 42b of the first pipe 42, and the outlet 63 which communicates with the internal space of the housing 60 and the first gas supply path 43 of the first pipe 42 is formed in the connection portion.

Accordingly, a gas supply path through which the first gas is supplied from the first gas source GS1 to the semiconductor manufacturing apparatus 10A is formed.

The shaft 70 is columnar, a gap is provided between an outer peripheral surface 71 of the column of the shaft 70 and an inner wall surface 61 of the housing 60, the shaft 70 is accommodated in the internal space of the housing 60, and the shaft 70 can rotate about an axis Z of the shaft 70. Specifically, an outer diameter of the shaft 70 is smaller than an inner diameter of the housing 60. In addition, a length of the shaft 70 in the direction of the axis Z is shorter than a length of the cylindrical internal space of the housing 60 in the axial direction. That is, the shaft 70 has a size which can be accommodated in the internal space of the housing 60 in a state where the gap is provided. The gap is a distance between the outer peripheral surface 71 of the shaft 70 and the inner wall surface 61 of the housing 60 when the axis Z of the shaft 70 and the axis of the internal space of the housing 60 coincide with each other, and for example, is approximately 0.013 mm.

The shaft 70 is connected to the rotary shaft 73 in the direction of the axis Z. In addition, the shaft 70 can rotate about the axis Z by the driving of the motor M1. In this case, since the outer diameter of the shaft 70 is smaller than the inner diameter of the housing 60, the shaft 70 can rotate without coming into contact with the inner wall surface 61 of the housing 60. Accordingly, the outer peripheral surface 71 of the shaft 70 and the inner wall surface 61 of the housing 60 do not wear out, and improved endurance is obtained. In addition, in a case where the shaft 70 is connected to the rotary shaft 73 and is driven by the motor M1, a through hole 65 through which the rotary shaft 73 is disposed is formed on the side wall of the housing 60 facing the motor M1. In addition, a seal member may be provided between the rotary shaft 73 and the through hole 65 of the housing 60.

A through hole 72 which penetrates the shaft 70 is formed on the outer peripheral surface 71 of the shaft 70, and both ends of the through hole 72 correspond to the inlet 62 and the outlet 63 of the housing 60. Specifically, in the shaft 70, the through hole 72 is formed in a direction orthogonal to the axis Z, and both ends of the through hole 72 are formed on the outer peripheral surface 71 of the shaft 70. In addition, when the shaft 70 rotates about the axis Z and is positioned at a predetermined rotation angle, one end of the through hole 72 is positioned at the inlet 62 of the housing 60, and the other end of the through hole 72 is positioned at the outlet 63 of the housing 60. That is, when the shaft 70 is positioned at a predetermined rotation angle, the through hole 72 forms the gas supply path through which the first gas is supplied from the first gas source GS1 to the semiconductor manufacturing apparatus 10A along with the first gas supply path 43 of the first pipe 42 and the internal space of the housing 60.

Figure 3A:
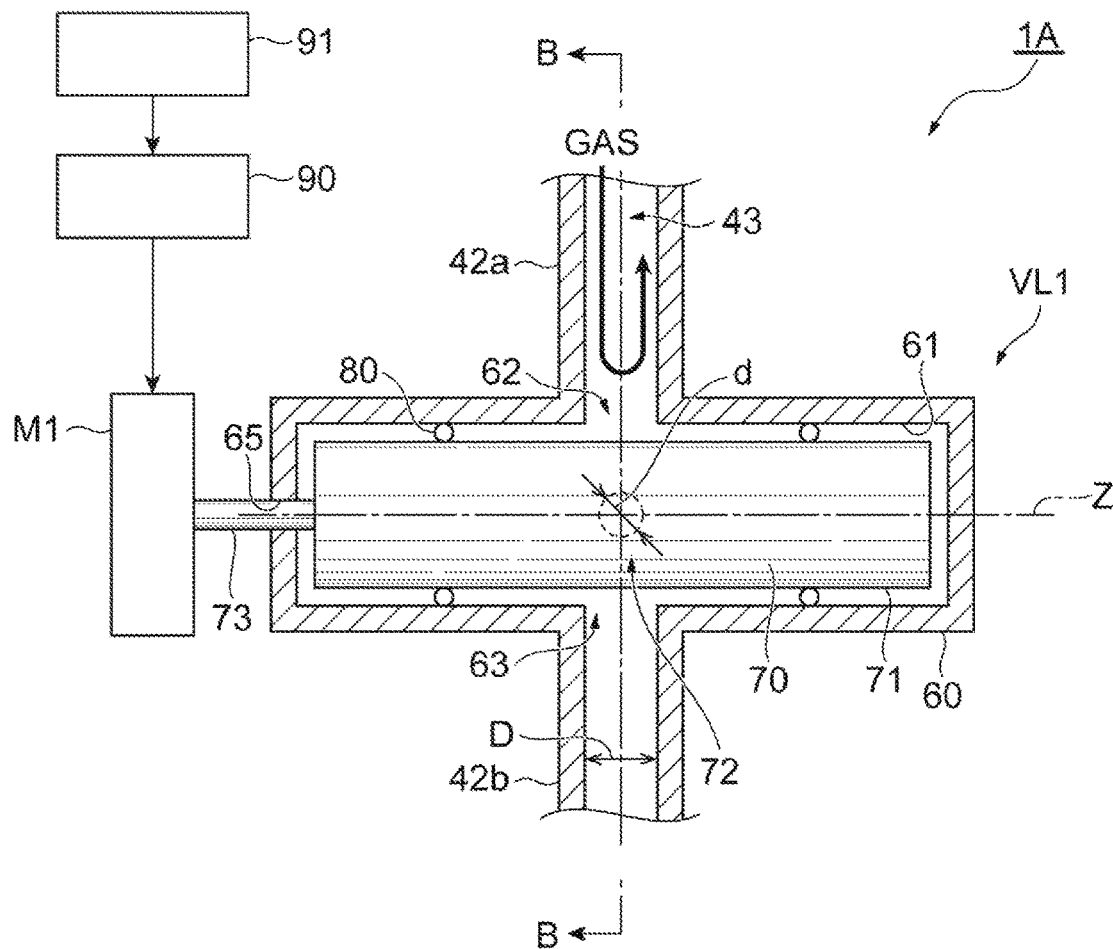
FIGS. 3A and 3B are sectional views schematically showing the exemplary gas supply mechanism.
Figure 3B:
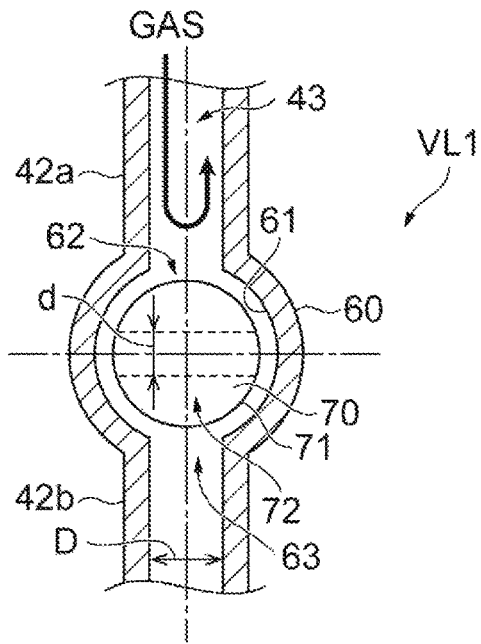

The first valve VL1 is open when the shaft 70 rotates about the axis Z and both ends of the through hole 72 are positioned at the inlet 62 and the outlet 63 of the housing 60, and the first gas supplied from the first gas source GS1 passes through the first valve VL1 and flows to the semiconductor manufacturing apparatus 10A. The first valve VL1 is closed when the shaft 70 further rotates about the axis Z and both ends of the through hole 72 are not positioned at the inlet 62 and the outlet 63 of the housing 60, and the first gas supplied from the first gas source GS1 is blocked by the shaft 70 and does not flow to the semiconductor manufacturing apparatus 10A. FIGS. 3A and 3B are views showing when the axis of the through hole 72 of the shaft 70 is positioned at the position orthogonal to the axis of the first gas supply path 43. In this case, both ends of the through hole 72 are not positioned at the inlet 62 and the outlet 63 of the housing 60, and the first valve VL1 is closed. In addition, the first gas supplied from the first gas source GS1 is blocked by the shaft 70 in the vicinity of the inlet 62 of the housing 60, and is not supplied to the semiconductor manufacturing apparatus 10A.

An opening/closing function of the first valve VL1 is verified by the following conditions. When the first valve VL1 is closed, the first gas flows from the inlet 62 of the housing 60 into the internal space of the housing 60, and is leaked to the semiconductor manufacturing apparatus 10A from the outlet 63 of the housing 60 via the gap between the housing 60 and the shaft 70. For example, the gap between the shaft 70 and the housing 60 is approximately 0.013 mm. However, specifically, the diameter of the shaft 70 is set to φ20g4 (Japanese Industrial Standards), the diameter of the internal space of the housing 60 is set to φ20H6 (Japanese Industrial Standards), and the gap between the shaft 70 and the housing 60 is set to 0.004 to 0.013 mm. Under the conditions, the first valve VL1 is closed and the first gas is supplied from the first gas source GS1 to the upstream portion 42a of the first pipe 42 by the control of the gas control unit 92. In addition, an internal pressure of the upstream portion 42a of the first pipe 42 is measured by changing the flow rate of the supply of the first gas. When the flow rate of the first gas supplied to the upstream portion 42a of the first pipe 42 is 1 sccm, the internal pressure of the upstream portion 42a of the first pipe 42 reaches 89 Torr. In addition, when the flow rate is 5 sccm, the internal pressure of the upstream portion 42a of the first pipe 42 reaches 172 Torr, and when the flow rate reaches 20 sccm, the internal pressure of the upstream portion 42a of the first pipe 42 reaches 315 Torr. In this way, when the first valve VL1 is closed, it is confirmed that the internal pressure of the upstream portion 42a of the first pipe 42 increases, that is, the first valve VL1 functions as a valve.

In addition, since the gap is positioned between the outer peripheral surface 71 of the shaft 70 and the inner wall surface 61 of the housing 60, even when the first valve VL1 is closed, it is not possible to completely interrupt the flow of the first gas. That is, even when both ends of the through hole 72 are not positioned at the inlet 62 and the outlet 63 of the housing 60, the first gas which have flowed from the inlet 62 to the housing 60 can flow to the outlet 63 through the gap which is formed between the outer peripheral surface 71 of the shaft 70 and the inner wall surface 61 of the housing 60. Hereinafter, an outflow route of the first gas from the inlet 62 to the outlet 63 when the first valve VL1 is closed is referred to as a leakage route. As the gap between the outer peripheral surface 71 of the shaft 70 and the inner wall surface 61 of the housing 60 is narrowed and the leakage route is lengthened, the conductance of the first valve VL1 decreases. That is, in order to decrease the conductance in the first valve VL1, the outflow route may be narrowed and lengthened by narrowing the gap formed between the outer peripheral surface 71 of the shaft 70 and the inner wall surface 61 of the housing 60 and increasing diameters of the shaft 70 and the housing 60. In this way, the conductance of the first valve VL1 is easily adjusted by adjusting the gap of the first valve VL1 and the dimensions thereof in the radial direction.

A relationship between a diameter d of the through hole 72 and a diameter D of the first gas supply path 43 can be appropriately set. For example, in a case where the diameter d of the through hole 72 is equal to or more than the diameter D of the first gas supply path 43, the first valve VL1 can supply the first gas which flows through the first gas supply path 43 to the first gas diffusion chamber 38a without decreasing the conductance of the first gas supply path 43. Meanwhile, in a case where the diameter d of the through hole 72 is smaller than the diameter D of the first gas supply path 43, the first valve VL1 can function as a throttle valve which decreases the conductance of the first gas supply path 43.

A plurality of seal members 80 which are in contact with the inner wall surface 61 of the housing 60 and the outer peripheral surface 71 of the shaft 70 are provided between the inner wall surface 61 of the housing 60 and the outer peripheral surface 71 of the shaft 70. The plurality of seal members 80 are provided such that the inlet 62 and the outlet 63 of the housing 60 are disposed between the seal members 80 in the direction of the axis Z of the shaft 70. Specifically, as shown in FIGS. 3A and 3B, each of the seal members 80 is annular, is attached to the outer peripheral surface 71 of the shaft 70, and is in contact with the outer peripheral surface 71 of the shaft 70. In addition, at least one seal member 80 is provided on both sides of the through hole 72 of the shaft 70 in the direction of the axis Z. In addition, the shaft 70 to which the plurality of seal members 80 are attached is accommodated in the housing 60. In this case, the outer periphery of the seal member 80 is in contact with the inner wall surface 61 of the housing 60, and the seal members 80 are positioned on both side of the inlet 62 and the outlet 63 of the housing 60 in the direction of the axis Z. The seal members 80 can prevent the first gas from leaking from the inlet 62 to the outlet 63 through the gap between the inner wall surface 61 of the housing 60 and the outer peripheral surface 71 of the shaft 70 in the direction of the axis Z when the first valve VL1 is closed.

Next, a gas supply method to the semiconductor manufacturing apparatus 10A using the gas supply device 10B will be described with reference to FIG. 4. FIG. 4 is a flowchart showing a gas supply method MT of the gas supply device 10B. In the gas supply method MT, the first gas and the second gas are alternately supplied to the processing container 12 via the first gas supply mechanism 1A and the second gas supply mechanism 1B, respectively.

Here, a mode when the first valve VL1 is open (FIGS. 2A and 2B), that is, a mode when the axis of the through hole 72 of the shaft 70 coincides with the axis of the first gas supply path 43 and both ends of the through hole 72 are positioned at the inlet 62 and the outlet 63 of the housing 60 is referred to as a first mode, and in this case, an angle between the axis of the through hole 72 and the axis of the first gas supply path 43 is referred to as a first rotation angle $\theta1$ (0°). In addition, a mode when the first valve VL1 is closed (FIGS. 3A and 3B), that is, a mode when the axis of the through hole 72 of the shaft 70 and the axis of the first gas supply path 43 are orthogonal to each other and both ends of the through hole 72 are not positioned at the inlet 62 and the outlet 63 of the housing 60 is referred to as a second mode, and in this case, an angle between the axis of the through hole 72 and the axis of the first gas supply path 43 is referred to as a second rotation angle $\theta2$ (90°). In addition, a mode when the shaft 70 rotates about the axis Z at a constant angular speed is referred to as a third mode.

In the gas supply method MT, first, a process ST1 is performed. In the process ST1, the first gas is supplied to the processing container 12, and supply of the second gas is stopped. Accordingly, the main control unit 91 transmits a control signal to the gas control unit 92. If the gas control unit 92 receives this control signal, the gas control unit 92 controls the first flow rate controller FC1 such that the first gas is supplied to the first pipe 42 and controls the second flow rate controller FC2 such that the supply of the second gas with respect to the second pipe 44 is stopped.

In addition, in the process ST1, the main control unit 91 also transmits a control signal to the motor control unit 90. If the motor control unit 90 receives this control signal, the motor control unit 90 controls the motor M1 of the first valve VL1 such that the shaft 70 of the first valve VL1 becomes the first rotation angle $\theta1$. In addition, the motor control unit 90 controls the motor M2 of the second valve VL2 such that the shaft of the second valve VL2 becomes the second rotation angle $\theta2$. That is, the motor control unit 90 sets the mode of the first valve VL1 to the first mode and sets the mode of the second valve VL2 to the second mode.

According to the above-described controls, in the process ST1, the first gas is supplied from the first gas source GS1 to the first pipe 42. In addition, after the first gas passes through the first valve VL1 and is diffused in the first gas diffusion chamber 38a, the first gas is supplied to the processing container 12. Meanwhile, the supply of the second gas from the second gas source GS2 is stopped by the second flow rate controller FC2. In addition, in the semiconductor manufacturing apparatus 10A, the workpiece W is processed using the first gas which is supplied into the processing container 12. For example, plasma of the first gas is generated in the processing container 12 and the workpiece W is etched.

In the gas supply method MT, subsequently, a process ST2 is performed. In the process ST2, the main control unit 91 transmits a control signal to the gas control unit 92. If the gas control unit 92 receives this control signal, the gas control unit 92 controls the second flow rate controller FC2 such that the second gas is supplied to the second pipe 44. In this case, since the second valve VL2 is set to the second mode in the process ST1, the second gas from the second gas source GS2 remains in the upstream portion 44a of the second pipe 44. Accordingly, in the process ST2, the internal pressure of the upstream portion 44a of the second pipe 44 increases.

Subsequently, a process ST3 is performed. In the process ST3, the gas which is supplied to the processing container 12 is switched from the first gas to the second gas. Accordingly, the main control unit 91 transmits a control signal to the gas control unit 92. If the gas control unit 92 receives this control signal, the gas control unit 92 controls the first flow rate controller FC1 such that the supply of the first gas with respect to the first pipe 42 is stopped. In addition, the gas control unit 92 controls the second flow rate controller FC2 such that the second gas is supplied to the second pipe 44.

In addition, in the process ST3, the main control unit 91 also transmits a control signal to the motor control unit 90. If the motor control unit 90 receives this control signal, the motor control unit 90 controls the motor M1 of the first valve VL1 such that the rotation angle of the shaft 70 of the first valve VL1 becomes $\theta2$. In addition, the motor control unit 90 controls the motor M2 of the second valve VL2 such that the shaft of the second valve VL2 rotates at a constant angular speed. That is, the motor control unit 90 sets the first valve VL1 to the second mode and sets the second valve VL2 to the third mode.

According to the above-described control, in the process ST3, the supply of the first gas into the processing container 12 is stopped by the first flow rate controller FC1 and the first valve VL1. Meanwhile, since the conductance of the second gas supply path is periodically changed, the second gas from the second gas source GS2 is intermittently supplied into the processing container 12. Accordingly, the pressure inside the processing container 12 is finely controlled so as to approach a target value. In addition, in the process ST2, since a pressure difference is generated between the upstream portion 44a of the second pipe 44 and the processing space S, it is possible to introduce the second gas into the processing space S while discharging the first gas from the processing space S in a short period of time.

Subsequently, a process ST4 is performed. For example, after the pressure of the second gas inside the processing container 12 is stabilized so as to be the target value in the process ST3, the process ST4 is performed. In the process ST4, the main control unit 91 transmits a control signal to the motor control unit 90. If the motor control unit 90 receives this control signal, the motor control unit 90 controls the motor M2 of the second valve VL2 such that the shaft of the second valve VL2 becomes the first rotation angle $\theta1$. Accordingly, the second gas from the second gas source GS2 is continuously supplied into the processing container 12. In addition, in the process ST4, since the flow rate of the second gas supplied into the processing container 12 is adjusted, the rotation angle of the shaft of the second valve VL2 may be set to a predetermined range of $\pm \Delta\theta$ based on the first rotation angle $\theta1$.

Subsequently, a process ST5 is performed. In the process ST5, it is determined whether or not end conditions are satisfied. For example, whether or not end conditions are satisfied may be determined according to whether or not the number of switching times of the gas supplied to the processing space S reaches a preset number of times. In a case where it is determined that the end conditions are satisfied in the process ST5, the gas supply method MT ends. Meanwhile, in a case where it is determined that the end conditions are not satisfied in the process ST5, a process ST6 is performed.

In the process ST6, a control signal is transmitted from the main control unit 91 to the gas control unit 92. If the gas control unit 92 receives this control signal, the gas control unit 92 controls the first flow rate controller FC1 such that the first gas is supplied to the first pipe 42. In this case, since the first valve VL1 is set to the second mode in the process ST3, the first gas from the first gas source GS1 remains in the upstream portion 42a of the first pipe 42. Accordingly, in the process ST6, the internal pressure of the upstream portion 42a of the first pipe 42 increases.

Subsequently, a process ST7 is performed. In the process ST7, the gas supplied into the processing container 12 is switched from the second gas to the first gas. Accordingly, the main control unit 91 transmits a control signal to the gas control unit 92. If the gas control unit 92 receives this control signal, the gas control unit 92 controls the first flow rate controller FC1 such that the first gas is supplied to the first pipe 42. Moreover, the gas control unit 92 controls the second flow rate controller FC2 such that the supply of the second gas with respect to the second pipe 44 is stopped.

Moreover, in the process ST7, the main control unit 91 also transmits a control signal to the motor control unit 90. If the motor control unit 90 receives this control signal, the motor control unit 90 controls the motor M1 of the first valve VL1 such that the shaft 70 of the first valve VL1 rotates at a constant angular speed. In addition, the motor control unit 90 controls the motor M2 of the second valve VL2 such that the shaft of the second valve VL2 becomes the second rotation angle θ2. That is, the motor control unit 90 sets the mode of the first valve VL1 to the third mode, and sets the mode of the second valve VL2 to the second mode.

According to the above-described control, in the process ST7, the supply of the second gas into the processing container 12 is stopped by the second flow rate controller FC2 and the second valve VL2. Meanwhile, since the conductance of the first gas supply path is periodically changed, the first gas from the first gas source GS1 is intermittently supplied into the processing container 12. Accordingly, the pressure inside the processing container 12 is finely controlled so as to approach the target value. In addition, in the process ST6, since the pressure difference between the upstream portion 42a of the first pipe 42 and the processing space S is generated, it is possible to introduce the first gas into the processing space S while discharging the second gas from the processing space S in a short period of time.

Subsequently, a process ST8 is performed. For example, after the pressure of the first gas inside the processing container 12 is stabilized so as to be the target value in the process ST7, the process ST8 is performed. In the process ST8, the main control unit 91 transmits a control signal to the motor control unit 90. If the motor control unit 90 receives this control signal, the motor control unit 90 controls the motor M1 of the first valve VL1 such that the shaft 70 of the first valve VL1 becomes the first rotation angle θ1. Accordingly, the first gas from the first gas source GS1 is continuously supplied into the processing container 12. In addition, in the process ST8, since the flow rate of the first gas supplied into the processing container 12 is adjusted, the rotation angle of the shaft 70 of the first valve VL1 may be set to a predetermined range of ±Δθ based on the first rotation angle θ1. After the process ST8, the process ST1 is performed.

As described above, in the gas supply method MT, the first gas and the second gas are alternately supplied into the processing container 12. Immediately after the gas supplied into the processing container 12 is switched from the first gas to the second gas, the pressure difference between the inside of the second pipe 44 and the inside of the processing container 12 is generated, and thereafter, the second gas is intermittently supplied into the processing container 12. On the other hand, immediately after the gas supplied into the processing container 12 is switched from the second gas to the first gas, the pressure difference between the inside of the first pipe 42 and the inside of the processing container 12 is generated, and thereafter, the first gas is intermittently supplied into the processing container 12. Accordingly, when the gas to be supplied is switched, the gas inside the processing container 12 is early switched, and the pressure inside the processing container 12 can be early stabilized to the target value. Therefore, according to the gas supply method MT, since it is possible to shorten a time required for switching the processes, it is possible to improve processing throughput of the workpiece W.

Figure 5A:
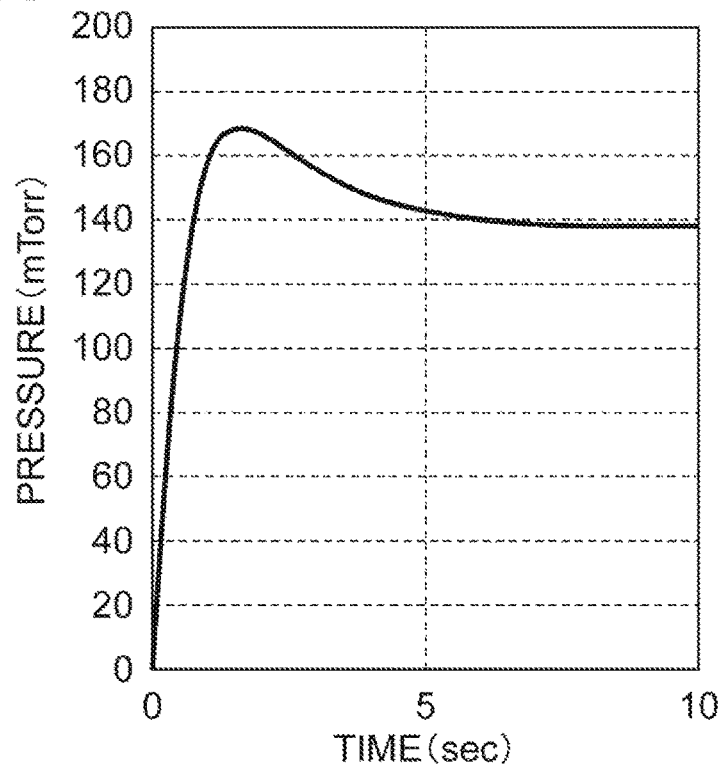
FIGS. 5A and 5B show simulation results indicating a temporal change of a pressure inside a processing space.
Figure 5B:
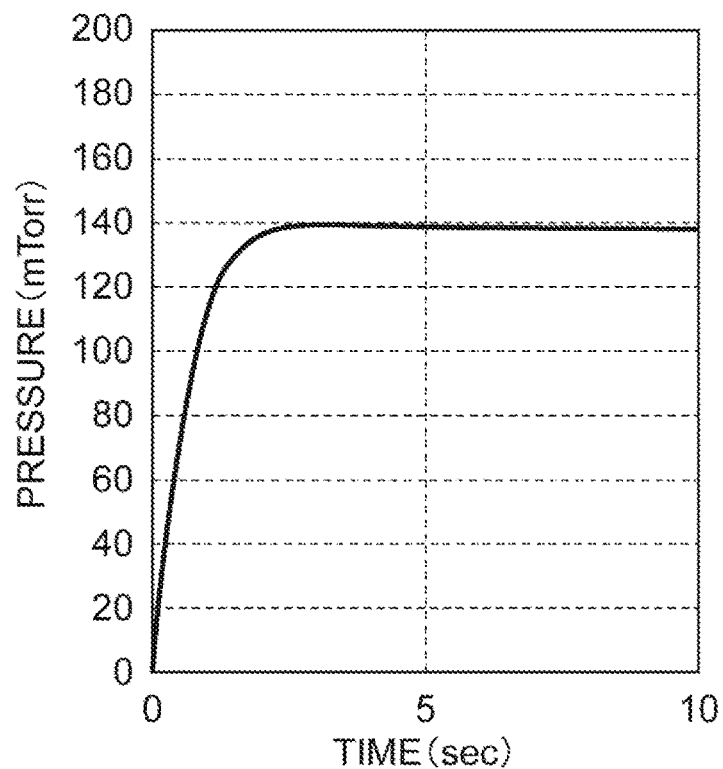

The above-described effects will be described in more detail with reference to FIGS. 5A and 5B. FIGS. 5A and 5B are simulation results showing a temporal change of the pressure inside the processing container 12. FIG. 5A is the simulation results showing the temporal change of the pressure inside the processing container 12 in a case where the first gas or the second gas which remains in the upstream portion 42a of the first pipe 42 or the upstream portion 44a of the second pipe 44 and becomes a high pressure is supplied into the processing container 12 at once, and FIG. 5B is the simulation results showing the temporal change of the pressure inside the processing container 12 in a case where the first gas or the second gas which remains in the upstream portion 42a of the first pipe 42 or the upstream portion 44a of the second pipe 44 and becomes a high pressure is intermittently supplied into the processing container 12. For example, the target value of the pressure inside the processing container 12 is 140 mTorr. In the case of FIG. 5A, the pressure inside the processing container 12 overshoots the target value, and the time required until the pressure inside the processing container 12 is stabilized so as to be the target value after the supply start of the first gas or the second gas is five seconds or more. In the case of FIG. 5B, the pressure inside the processing container 12 does not overshoot the target value, and the time required until the pressure inside the processing container 12 is stabilized so as to be the target value after the supply start of the first gas or the second gas is five seconds or less. That is, as described above, since the pressure inside the processing container 12 is early stabilized so as to be the target value using the first gas supply mechanism 1A, the second gas supply mechanism 1B, and the gas supply method MT, it is confirmed that the time required for switching the processes in the semiconductor manufacturing system 10 can be shortened.

Figure 6A:
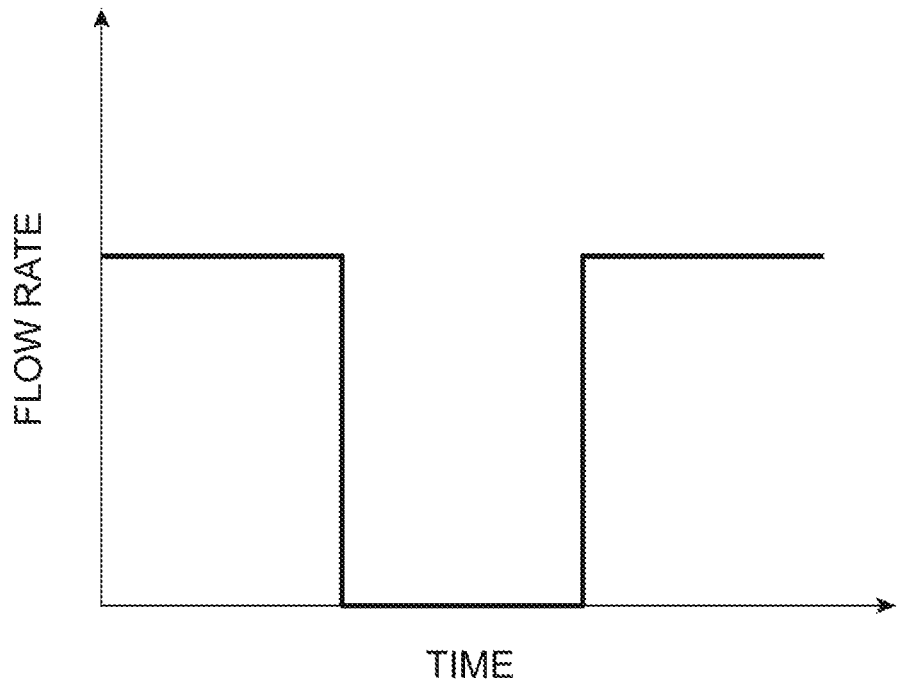
FIGS. 6A and 6B are graphs showing a flow rate of gas in a case where a duty ratio is changed.
Figure 6B:
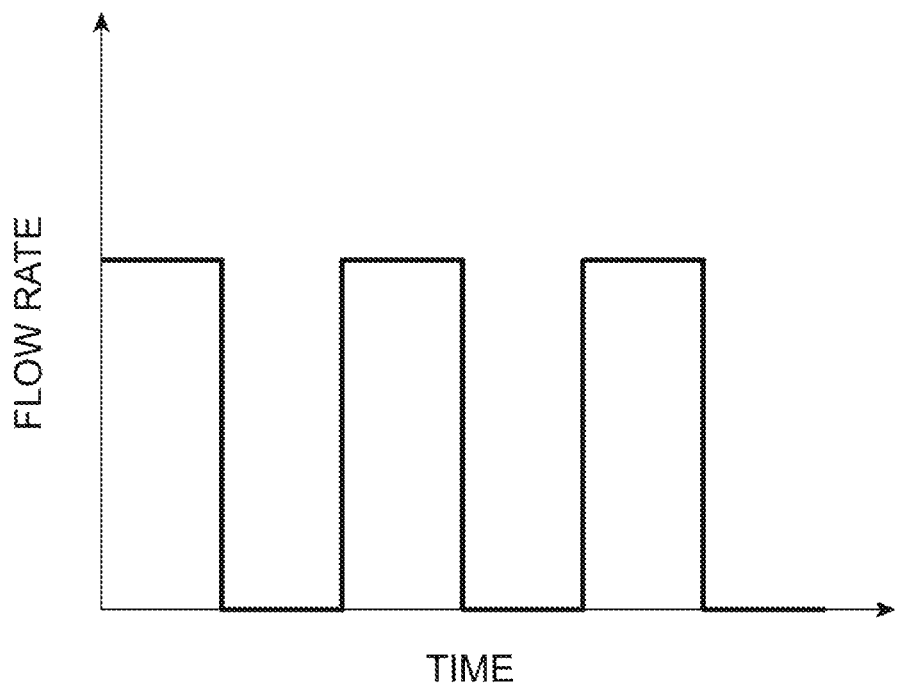

In addition, in processes ST3 and ST7, each of the second valve VL2 and the first valve VL1 is set to the third mode by the motor control unit 90. In this case, the angular speed of the shaft of each of the second valve VL2 and the first valve VL1 can be freely set if necessary. FIGS. 6A and 6B are graphs showing the flow rate of gas in a case where a duty ratio is changed. As shown in FIGS. 6A and 6B, the second gas and the first gas can be supplied to the semiconductor manufacturing apparatus 10A by changing the duty ratio of On/Off.

Hereinbefore, in the first gas supply mechanism 1A according to the first exemplary embodiment, the shaft 70 rotates, the first valve VL1 is open when both ends of the through hole 72 are positioned at the inlet 62 and the outlet 63 of the housing 60, and the first gas supplied from the first gas source GS1 passes through the first valve VL1 and flows to the semiconductor manufacturing apparatus 10A. The shaft 70 further rotates, the first valve VL1 is closed when both ends of the through hole 72 are positioned at the inlet 62 and the outlet 63 of the housing 60, the first gas supplied from the first gas source GS1 is blocked by the shaft 70 and does not flow to the semiconductor manufacturing apparatus 10A. In this way, since the first gas supply mechanism 1A does not have a configuration of a diaphragm type valve in which a diaphragm seats on a valve seat so as to block a flow path, rapid progression of wear at a location at which the diaphragm and the valve seat abut on each other does not occur, the valve is not damaged, and improved endurance is obtained. Moreover, in the first gas supply mechanism 1A, since the housing 60 has a cylindrical internal space and the shaft 70 is columnar, it is possible to accommodate the shaft 70 in the internal space of the housing 60 in the direction of the axis Z of the shaft 70, and it is possible to easily assemble the first valve VL1.

The first gas supply mechanism 1A further includes the plurality of seal members 80 which are in contact with the inner wall surface 61 of the housing 60 and the outer peripheral surface 71 of the shaft 70, and the plurality of seal members 80 are provided such that the inlet 62 and the outlet 63 are disposed between the seal members 80 in the direction of the axis Z of the shaft 70. Accordingly, it is possible to prevent the first gas from leaking from the inlet 62 to the outlet 63 through the gap between the inner wall surface 61 of the housing 60 and the outer peripheral surface 71 of the shaft 70.

The first gas supply mechanism 1A further includes the motor (drive unit) M1 which rotates the shaft 70 about the axis Z of the shaft 70 and the motor control unit (control unit) 90 which controls the motor M1. Accordingly, it is possible to automatically control the rotation angle of the shaft 70.

The semiconductor manufacturing system 10 according to the first exemplary embodiment includes the above-described first gas supply mechanism 1A. Accordingly, it is possible to provide the semiconductor manufacturing system 10 having improved endurance.

(Second Exemplary Embodiment)

Compared to the first exemplary embodiment, in a second exemplary embodiment, only the first gas supply mechanism 1A and the second gas supply mechanism 1B are different. In the second exemplary embodiment, differences with respect to the first exemplary embodiment are mainly described, and overlapping descriptions thereof are omitted. In addition, since the configuration of the second gas supply mechanism 1B is the same as that of the first gas supply mechanism 1A, detailed description thereof is omitted.

Figure 7:
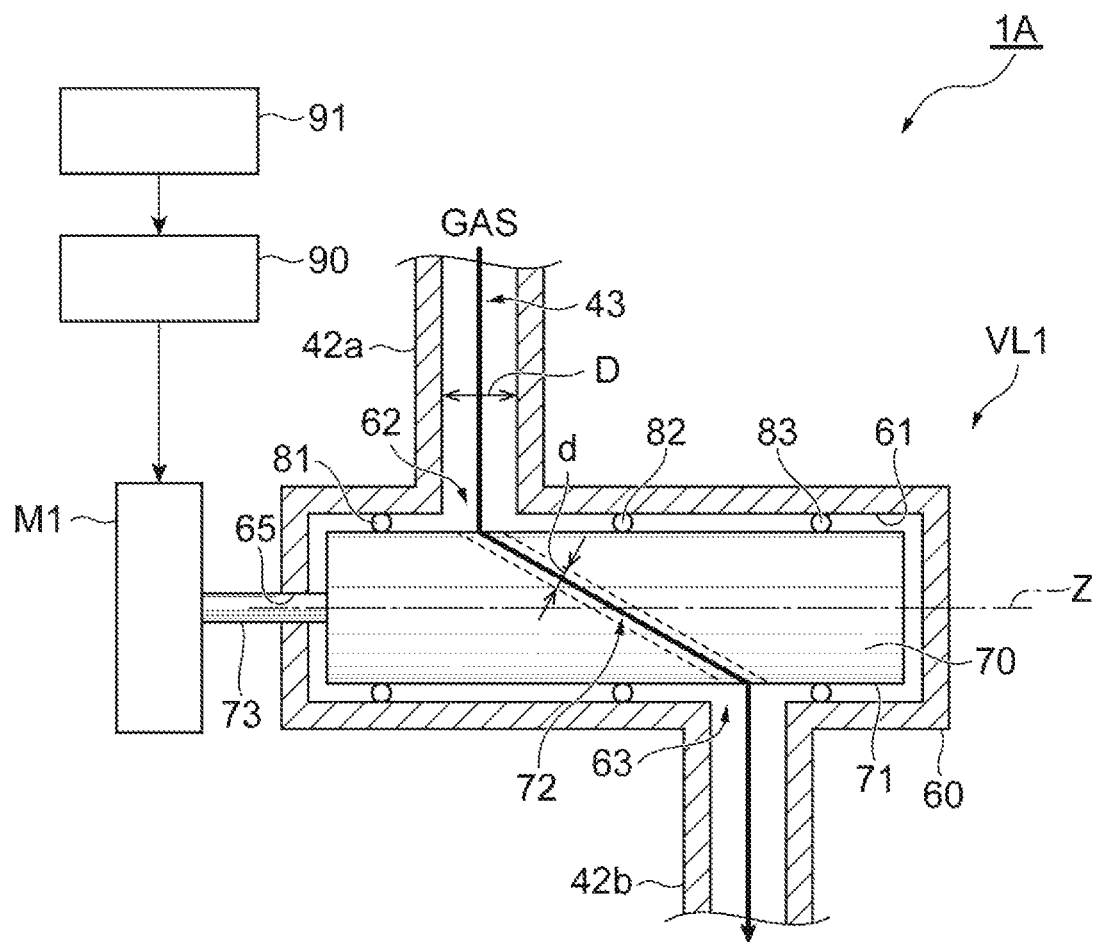
FIG. 7 is a sectional view schematically showing a gas supply mechanism according to an exemplary embodiment.

FIG. 7 is a sectional view schematically showing a first gas supply mechanism 1A according to the second exemplary embodiment. As shown in FIG. 7, the axis of the upstream portion 42a of the first pipe 42 and the axis of the downstream portion 42b are not disposed on a linear line. That is, the inlet 62 which is formed at the connection portion between the upstream portion 42a of the first pipe 42 and the housing 60 and the outlet 63 which is formed at the connection portion between the downstream portion 42b of the first pipe 42 and the housing 60 are not positioned on a linear line in the direction orthogonal to the axis Z. Accordingly, both ends of the through hole 72 which correspond to the inlet 62 and the outlet 63 and are formed on the outer peripheral surface 71 of the shaft 70 are not positioned on a linear line in the direction orthogonal to the axis Z. That is, the axis of the through hole 72 is not orthogonal to the axis Z and obliquely intersects the axis Z.

As shown in FIG. 7, the first gas supply mechanism 1A includes three seal members 81, 82, and 83. The seal members 81 and 82 are provided such that the inlet 62 is disposed between the seal members 81 and 82, and the seal member 83 is provided such that the outlet 63 is disposed between the seal members 82 and 83.

In this case, the first mode of the first valve VL1 is the mode when the first valve VL1 is open (FIG. 7), that is, the mode when both ends of the through hole 72 are positioned at the inlet 62 and the outlet 63 of the housing 60, and in this time, the rotation angle of the shaft 70 becomes the first rotation angle θ1 (0°). Moreover, the second mode of the first valve VL1 is the mode when the first valve VL1 is closed (not shown), that is, the mode when both ends of the through hole 72 are not positioned at the inlet 62 and the outlet 63 of the housing 60, and in this time, the rotation angle of the shaft 70 becomes the second rotation angle θ2 (180°). Moreover, other configurations of the first gas supply mechanism 1A are the same as those of the first exemplary embodiment.

Hereinbefore, in the first gas supply mechanism 1A according to the second exemplary embodiment, when the first valve VL1 is closed, the first gas flows from the inlet 62 of the housing 60 to the internal space of the housing 60, passes through the through hole 72 of the shaft 70 via the gap between the housing 60 and the shaft 70, and thereafter, leaks from the outlet 63 of the housing 60 to the semiconductor manufacturing apparatus 10A via the gap between the housing 60 and the shaft 70 again. That is, when the first valve VL1 is closed, compared to the first exemplary embodiment, in the first gas supply mechanism 1A according to the second exemplary embodiment, since the leakage route of the first gas is longer, it is possible to further decrease the conductance of the first valve VL1. The first valve VL1 is closed, the first gas having the same flow rate is supplied to the upstream portion 42a of the first pipe 42, and the internal pressure of the upstream portion 42a is simulated. As a result, compared to the first exemplary embodiment, when the first gas supply mechanism 1A according to the second exemplary embodiment is used, it is confirmed that the internal pressure of the upstream portion 42a increases approximately twice. That is, compared to the first exemplary embodiment, in the first gas supply mechanism 1A according to the second exemplary embodiment, the conductance of the first valve VL1 can be decreased approximately twice.

(Third Exemplary Embodiment)

Compared to the first exemplary embodiment, in a third exemplary embodiment, only the first gas supply mechanism 1A and the second gas supply mechanism 1B are different. In the third exemplary embodiment, differences with respect to the first exemplary embodiment are mainly described, and overlapping descriptions thereof are omitted. In addition, since the configuration of the second gas supply mechanism 1B is the same as that of the first gas supply mechanism 1A, detailed description thereof is omitted.

Figure 8:
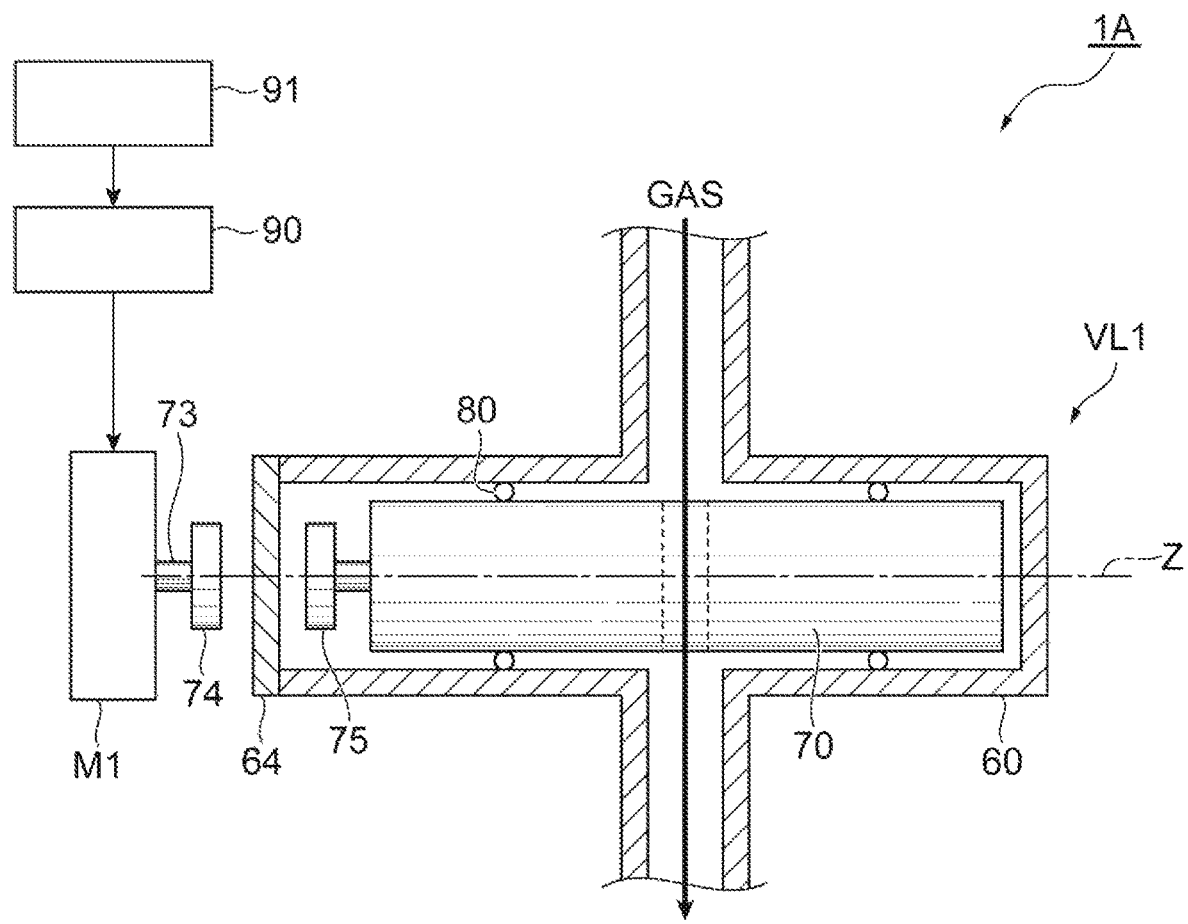
FIG. 8 is a sectional view schematically showing a gas supply mechanism according to an exemplary embodiment.

FIG. 8 is a sectional view schematically showing a first gas supply mechanism 1A according to the third exemplary embodiment. In the first gas supply mechanism 1A, the shaft 70 is directly connected to the rotary shaft 73. A drive-side magnet 74 which rotates according to the rotation of the motor M1 is connected to the rotary shaft 73 of the motor M1. Meanwhile, a driven-side magnet 75 which is disposed so as to face the drive-side magnet 74 via the side wall 64 of the housing 60 is fixed to the shaft 70. In this case, the through hole 65 for disposing the rotary shaft 73 is not formed on the side wall 64 of the housing 60. In addition, the axis of the rotary shaft 73 is coaxial with the axis Z of the shaft 70. The side wall 64 of the housing 60 is a nonmagnetic material, and for example, can use a material such as stainless steel or aluminum. The drive-side magnet 74 is connected to the rotary shaft 73 of the motor M1 between the motor M1 and the side wall 64 of the housing 60, and is separated from the side wall 64 of the housing 60 by a predetermined distance. The driven-side magnet 75 is fixed to the shaft 70 between the shaft 70 and the side wall 64 of the housing 60, and is separated from the side wall 64 of the housing 60 by a predetermined distance. In a case where the drive-side magnet 74 rotates according to the rotation of the motor M1, the driven-side magnet 75 rotates by a magnetic force between the drive-side magnet 74 and the driven-side magnet 75, and the shaft 70 which is fixed to the driven-side magnet 75 also rotates. In addition, other configurations of the first gas supply mechanism 1A are the same as those of the first exemplary embodiment.

Hereinbefore, in the first gas supply mechanism 1A according to the third exemplary embodiment, it is not necessary to directly connect the motor M1 provided outside the housing 60 and the shaft 70 accommodated in the housing 60 to each other via the side wall 64 of the housing, sealability of the housing 60 is improved, wear of the side wall 64 of the housing 60 is prevented, and endurance can be improved.

Hereinbefore, various embodiments are described. However, various modifications may be made without being limited to the above-described embodiments.

Figure 9A:
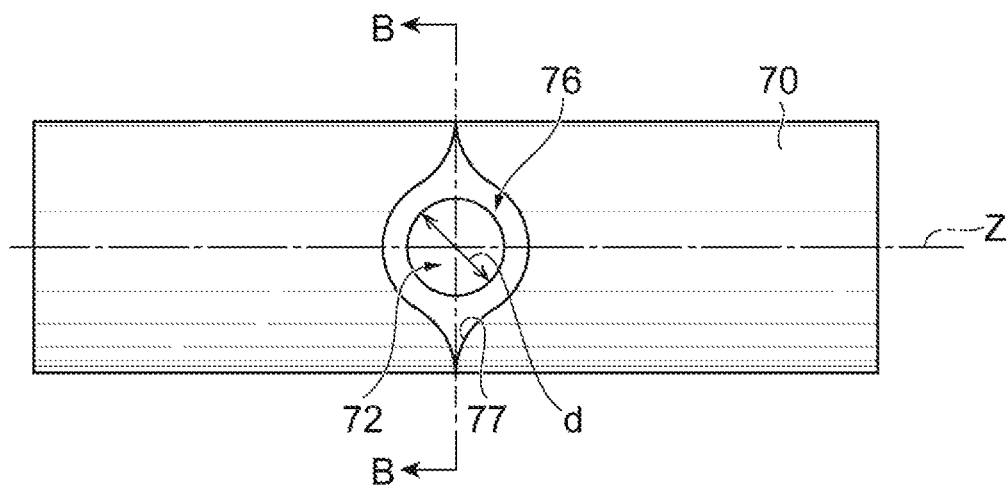
FIGS. 9A and 9B are views showing the details of a through hole of a shaft.
Figure 9B:
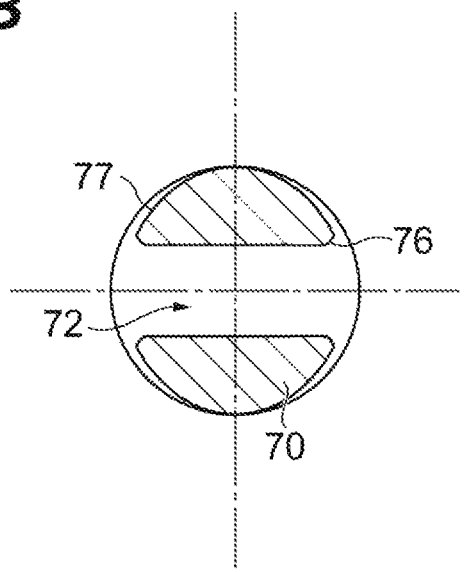
Figure 10A:
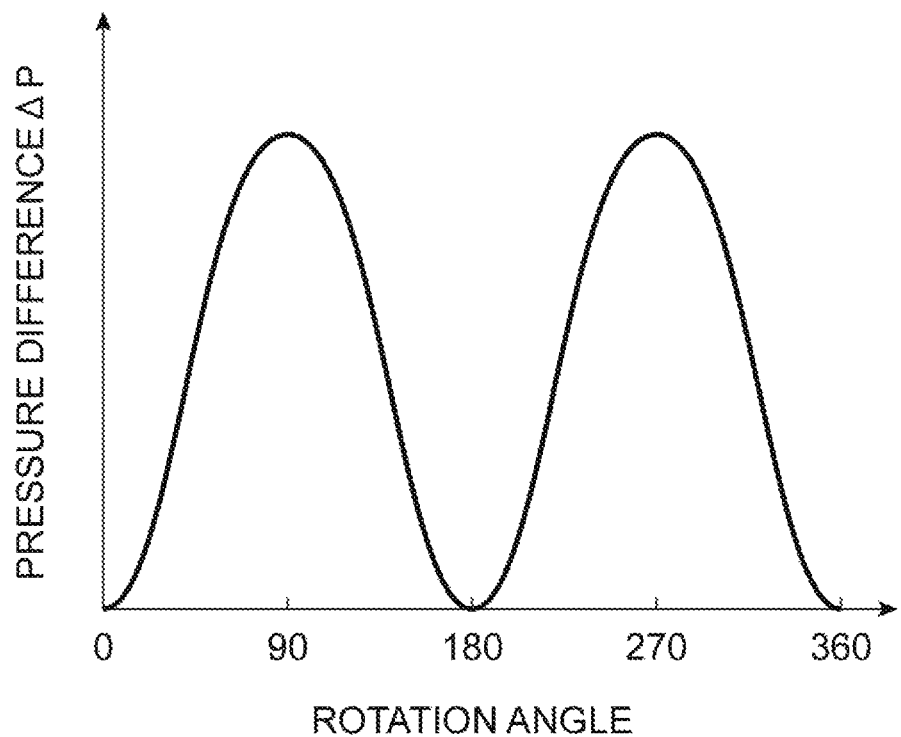
FIGS. 10A and 10B are graphs showing simulation results indicating a change of a pressure difference between an upstream side and a downstream side of a valve according to a change of an orifice area.
Figure 10B:
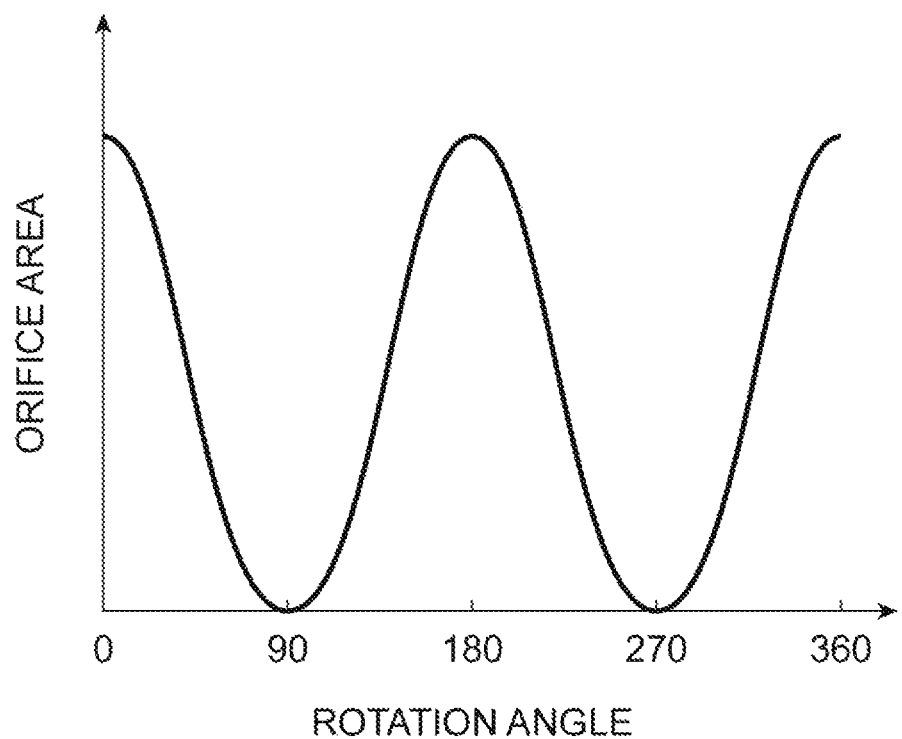

For example, the shape of the through hole 72 formed on the outer peripheral surface 71 of the shaft 70 may have the shape shown in FIGS. 9A and 9B. FIGS. 9A and 9B are views showing the details of the through hole 72 of the shaft 70. As shown in FIGS. 9A and 9B, in the shaft 70, after the through hole 72 having the diameter d is formed in the direction orthogonal to or intersecting the axis Z is formed, chamfering is performed on the outer peripheral surface 71 of the shaft 70, and a groove portions 77 is formed in the rotation direction of shaft 70 from a chamfered portion 76. Accordingly, an orifice area of the first valve VL1 by the rotation angle of the shaft 70 is gently changed, and the change of the orifice area of the first valve VL1 by the rotation angle of the shaft 70 can be sine waves. Therefore, the change of the pressure difference between the upstream side and the downstream side of the first valve VL1 can be sine waves. FIGS. 10A and 10B are graphs showing simulation results indicating the change of the pressure difference between the upstream side and the downstream side of the first valve VL1 according to the change of the orifice area of the first valve VL1. As shown in FIGS. 10A and 10B, the change of the orifice area of the first valve VL1 and the change of the pressure difference between the upstream side and the downstream side of the first valve according to the rotation of the shaft 70 can be sine waves using the through hole 72 shown in FIGS. 9A and 9B.

Moreover, in the above-described exemplary embodiments, the first valve VL1 has two or three seal members. However, the number of the seal members is not limited as long as it is possible to prevent the first gas from leaking from the inlet 62 to the outlet 63, and, for example, one seal member or four or more seal members may be used. In addition, the first valve VL1 may not have the seal member. Accordingly, it is possible to reduce the number of parts. Moreover, as the seal member 80, a seal member of the related art may be used as long as it is possible to prevent the first gas from leaking from the inlet 62 to the outlet 63, and the seal member 80 is not particularly limited.

In addition, the semiconductor manufacturing system 10 may include one gas supply mechanism or the plurality of gas supply mechanisms, and the number of the gas supply mechanisms is not limited.

In addition, each of the cross-sectional shapes of the gas supply paths formed in the first gas supply path 43 and the through hole 72 is a circular shape. However, the cross-sectional shapes are not limited to this. For example, each of the cross-sectional shapes of the gas supply paths may be a rectangular shape as long as it can transport the first gas and the second gas.

Moreover, in the first exemplary embodiment, the mode when the axis of the through hole 72 of the shaft 70 is orthogonal to the axis of the first gas supply path 43 and both ends of the through hole 72 are not positioned at the inlet 62 and the outlet 63 of the housing 60 is set to as the second mode, and in this case, the angle between the axis of the through hole 72 and the axis of the first gas supply path 43 is the second rotation angle $\theta 2$ (90°). However, the present disclosure is not limited to this. The second rotation angle $\theta 2$ is not limited to 90° as long as the inlet 62 of the housing 60 and one end of the through hole 72 overlap each other and the first gas does not flow into the through hole 72, and for example, the second rotation angle $\theta 2$ may be 45° or 60°. Moreover, in the second exemplary embodiment, the mode when the both ends of the through hole 72 of the shaft 70 are not positioned at the inlet 62 and the outlet 63 of the housing 60 is set to the second mode of the first valve VL1, and in this case, the rotation angle of the shaft 70 is the second rotation angle $\theta 2$ (180°). However, the present disclosure is not limited to this. The second rotation angle $\theta 2$ is not limited to 180° as long as the inlet 62 of the housing 60 and one end of the through hole 72 overlap each other and the first gas does not flow into the through hole 72, and for example, the second rotation angle $\theta 2$ may be 45° or 60°.

Moreover, the first gas supply mechanism 1A may not include the motor M1 and the motor control unit 90, and the shaft 70 of the first valve VL1 may be manually driven.

What is claimed is:

1. A gas supply mechanism for supplying a gas from a gas source to a semiconductor manufacturing apparatus, comprising:
    a pipe configured to connect the gas source and the semiconductor manufacturing apparatus to each other; and
    a valve provided in the pipe and configured to control a flow rate of the gas which is supplied from the gas source to the semiconductor manufacturing apparatus,
    wherein the valve includes a housing in which a cylindrical internal space is formed in the inside, and a columnar shaft,
    wherein the housing includes an inlet and an outlet, and a gas flows from the gas source into the internal space through the inlet, and a gas flows from the internal space to the semiconductor manufacturing apparatus through the outlet,
    wherein a gap is provided between an outer peripheral surface of the shaft and an inner wall surface of the housing, and the shaft is accommodated in the internal space of the housing and is rotatable about an axis of the shaft, and
    wherein a through hole which penetrates the shaft is formed on the outer peripheral surface of the shaft, both ends of the through hole are formed on the outer peripheral surface of the shaft, both ends of the through hole correspond to the inlet and the outlet, and an axis of the shaft is fixed in a direction orthogonal to the direction in which the gas flows into the inlet of the housing and the direction in which the gas flows out of the outlet of the housing.

2. The gas supply mechanism according to claim 1, further comprising:
    a plurality of seal members configured to contact with the inner wall surface of the housing and the outer peripheral surface of the shaft,
    wherein the plurality of seal members are provided such that the inlet and the outlet are disposed between the seal members in an axial direction of the shaft.

3. The gas supply mechanism according to claim 1, further comprising:

a drive unit configured to rotate the shaft about the axis of the shaft; and a control unit configured to control the drive unit.

4. The gas supply mechanism according to claim 2, further comprising:

a drive unit configured to rotate the shaft about the axis of the shaft; and a control unit configured to control the drive unit.

5. The gas supply mechanism according to claim 3, wherein the drive unit includes a rotary shaft and a drive-side magnet which is provided in the rotary shaft, wherein a driven-side magnet which is disposed to face the drive-side magnet via a side wall of housing is fixed to the shaft, and wherein the side wall of the housing is a nonmagnetic material.

6. The gas supply mechanism according to claim 4, wherein the drive unit includes a rotary shaft and a drive-side magnet which is provided in the rotary shaft, wherein a driven-side magnet which is disposed to face the drive-side magnet via a side wall of housing is fixed to the shaft, and wherein the side wall of the housing is a nonmagnetic material.

7. A semiconductor manufacturing system comprising a gas supply mechanism for supplying a gas from a gas source to a semiconductor manufacturing apparatus, the gas supply mechanism comprising:

a pipe configured to connect the gas source and the semiconductor manufacturing apparatus to each other; and a valve provided in the pipe and configured to control a flow rate of the gas which is supplied from the gas source to the semiconductor manufacturing apparatus, wherein the valve includes a housing in which a cylindrical internal space is formed in the inside, and a columnar shaft, wherein the housing includes an inlet and an outlet, and a gas flows from the gas source into the internal space through the inlet, and a gas flows from the internal space to the semiconductor manufacturing apparatus through the outlet, wherein a gap is provided between an outer peripheral surface of the shaft and an inner wall surface of the housing, and the shaft is accommodated in the internal space of the housing and is rotatable about an axis of the shaft, and wherein a through hole which penetrates the shaft is formed on the outer peripheral surface of the shaft, both ends of the through hole are formed on the outer peripheral surface of the shaft, both ends of the through hole correspond to the inlet and the outlet, and an axis of the shaft is fixed in a direction orthogonal to the direction in which the gas flows into the inlet of the housing and the direction in which the gas flows out of the outlet of the housing.

8. The semiconductor manufacturing system according to claim 7, wherein the gas supply mechanism further comprising:

a plurality of seal members configured to contact with the inner wall surface of the housing and the outer peripheral surface of the shaft, wherein the plurality of seal members are provided such that the inlet and the outlet are disposed between the seal members in an axial direction of the shaft.

9. The semiconductor manufacturing system according to claim 7, wherein the gas supply mechanism further comprising:

a drive unit configured to rotate the shaft about the axis of the shaft; and a control unit configured to control the drive unit.

10. The semiconductor manufacturing system according to claim 8, wherein the gas supply mechanism further comprising:

a drive unit configured to rotate the shaft about the axis of the shaft; and a control unit configured to control the drive unit.

11. The semiconductor manufacturing system according to claim 9, wherein the drive unit includes a rotary shaft and a drive-side magnet which is provided in the rotary shaft, wherein a driven-side magnet which is disposed to face the drive-side magnet via a side wall of housing is fixed to the shaft, and wherein the side wall of the housing is a nonmagnetic material.

12. The semiconductor manufacturing system according to claim 10, wherein the drive unit includes a rotary shaft and a drive-side magnet which is provided in the rotary shaft, wherein a driven-side magnet which is disposed to face the drive-side magnet via a side wall of housing is fixed to the shaft, and wherein the side wall of the housing is a nonmagnetic material.

13. A valve for controlling a flow rate of a gas supplied to a semiconductor manufacturing apparatus, comprising:

a gas inlet;

a gas outlet;

a housing disposed between the gas inlet and the gas outlet, the gas outlet connected to the semiconductor manufacturing apparatus; and a shaft accommodated in the housing and configured to rotate about an axis of the shaft, the shaft including a through hole, wherein both ends of the through hole are formed on an outer peripheral surface of the shaft, and both ends of the through hole correspond to the inlet and the outlet, wherein an axis of the shaft is fixed in a direction orthogonal to the direction in which the gas flows into the gas inlet and the direction in which the gas flows out of the outlet.

14. The gas supply mechanism according to claim 13, further comprising:

a plurality of seal members configured to contact with the inner wall surface of the housing and the outer peripheral surface of the shaft, wherein the plurality of seal members are provided such that the inlet and the outlet are disposed between the seal members in an axial direction of the shaft.

15. The gas supply mechanism according to claim 13, further comprising:

a drive unit configured to rotate the shaft about the axis of the shaft; and a control unit configured to control the drive unit.

16. The gas supply mechanism according to claim 14, further comprising:

a drive unit configured to rotate the shaft about the axis of the shaft; and a control unit configured to control the drive unit.

17. A gas supply mechanism for supplying a gas from a gas source to a semiconductor manufacturing apparatus, comprising:
- a pipe configured to connect the gas source and the semiconductor manufacturing apparatus to each other;
- a valve provided in the pipe and configured to control a flow rate of the gas which is supplied from the gas source to the semiconductor manufacturing apparatus;
- a drive unit configured to rotate the shaft about the axis of the shaft; and
- a control unit configured to control the drive unit,
- wherein the valve includes a housing in which a cylindrical internal space is formed in the inside, and a columnar shaft,
- wherein the housing includes an inlet and an outlet, and a gas flows from the gas source into the internal space through the inlet, and a gas flows from the internal space to the semiconductor manufacturing apparatus through the outlet,
- wherein a gap is provided between an outer peripheral surface of the shaft and an inner wall surface of the housing, and the shaft is accommodated in the internal space of the housing and is rotatable about an axis of the shaft,
- wherein a through hole which penetrates the shaft is formed on the outer peripheral surface of the shaft, both ends of the through hole are formed on the outer peripheral surface of the shaft, and both ends of the through hole correspond to the inlet and the outlet, and an axis of the shaft is fixed in a direction orthogonal to the direction in which the gas flows into the inlet of the housing and the direction in which the gas flows out of the outlet of the housing,
- wherein the drive unit includes a rotary shaft and a drive-side magnet which is provided in the rotary shaft,
- wherein a driven-side magnet which is disposed to face the drive-side magnet via a side wall of housing is fixed to the shaft,
- wherein the side wall of the housing is a nonmagnetic material, and
- wherein the drive-side magnet is magnetically connected to the driven-side magnet via the side wall of the housing, and the rotary shaft rotates in response to rotation of the drive-side magnet.

* * * * *